United States Patent
Kondoh et al.

(10) Patent No.: US 11,373,865 B2
(45) Date of Patent: Jun. 28, 2022

(54) METHOD FOR MANUFACTURING SEMICONDUCTOR DEVICE HAVING A FILM WITH LAYERS OF DIFFERENT CONCENTRATIONS OF ELEMENTS

(71) Applicant: Kioxia Corporation, Tokyo (JP)

(72) Inventors: Takehiro Kondoh, Yokkaichi Mie (JP); Junichi Hashimoto, Yokkaichi Mie (JP); Soichi Yamazaki, Yokkaichi Mie (JP); Yuya Matsubara, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/004,216

(22) Filed: Aug. 27, 2020

(65) Prior Publication Data

US 2021/0287903 A1 Sep. 16, 2021

(30) Foreign Application Priority Data

Mar. 11, 2020 (JP) .............................. JP2020-042268

(51) Int. Cl.
*H01L 21/00* (2006.01)
*H01L 21/033* (2006.01)
*H01L 21/308* (2006.01)
*H01L 21/02* (2006.01)

(52) U.S. Cl.
CPC ...... *H01L 21/0334* (2013.01); *H01L 21/0223* (2013.01); *H01L 21/0332* (2013.01); *H01L 21/0337* (2013.01); *H01L 21/3083* (2013.01); *H01L 21/3086* (2013.01); *H01L 21/3088* (2013.01)

(58) Field of Classification Search
None
See application file for complete search history.

(56) References Cited

U.S. PATENT DOCUMENTS

| 10,153,164 B2 | 12/2018 | Nakao et al. |
| 2010/0178771 A1* | 7/2010 | Oh ................... H01L 21/31144 438/700 |
| 2010/0327412 A1* | 12/2010 | Lee .................... H01L 21/0337 257/618 |
| 2012/0138931 A1* | 6/2012 | Nakatani ........... H01L 29/78609 257/57 |
| 2012/0190166 A1 | 7/2012 | Okuda |
| 2016/0064500 A1 | 3/2016 | Chen et al. |
| 2018/0261466 A1 | 9/2018 | Yamazaki et al. |
| 2020/0013620 A1 | 1/2020 | Fung et al. |
| 2020/0395221 A1 | 12/2020 | Tahara et al. |

FOREIGN PATENT DOCUMENTS

| TW | 201828363 A | 8/2018 |
| TW | 201907476 A | 2/2019 |
| TW | 202006823 A | 2/2020 |

* cited by examiner

*Primary Examiner* — Reema Patel
(74) *Attorney, Agent, or Firm* — Foley & Lardner LLP

(57) ABSTRACT

A method for manufacturing a semiconductor device includes: forming a first film on a substrate; forming a second film containing at least carbon on the first film; forming a hole in the second film; and forming a recess, which communicates with the hole, in the first film by etching using the second film as a mask. In this method, the second film includes a first layer formed on the first film, and a second layer formed on the first layer. The first layer having a higher oxygen concentration than the second layer.

16 Claims, 9 Drawing Sheets

METHOD FOR MANUFACTURING SEMICONDUCTOR DEVICE HAVING A FILM WITH LAYERS OF DIFFERENT CONCENTRATIONS OF ELEMENTS

CROSS-REFERENCE TO RELATED APPLICATION(S)

This application is based upon and claims the benefit of priority from Japanese Patent Application No. 2020-042268, filed Mar. 11, 2020, the entire contents of which are incorporated herein by reference.

FIELD

Embodiments described herein relate generally to a method for manufacturing a semiconductor device.

BACKGROUND

When forming a recess, such as a hole or slit, in a film on a substrate by etching, the recess sometimes cannot be suitably formed if the performance of an etching mask layer, formed on the film, is poor.

Examples of related art include U.S. Patent Application Publication No. 2012/0190166.

DETAILED DESCRIPTION

At least one embodiment provides a semiconductor device manufacturing method which can suitably form a recess in a film.

In general, according to at least one embodiment, a method for manufacturing a semiconductor device includes: forming a first film on a substrate; forming a second film containing at least carbon on the first film; forming a hole in the second film; and forming a recess, which communicates with the hole, in the first film by etching using the second film as a mask. In this method, the second film includes a first layer formed on the first film, and a second layer formed on the first layer. The first layer having a higher oxygen concentration than the second layer.

Embodiments of the present disclosure will now be described with reference to the drawings.

First Embodiment

Figure 1:
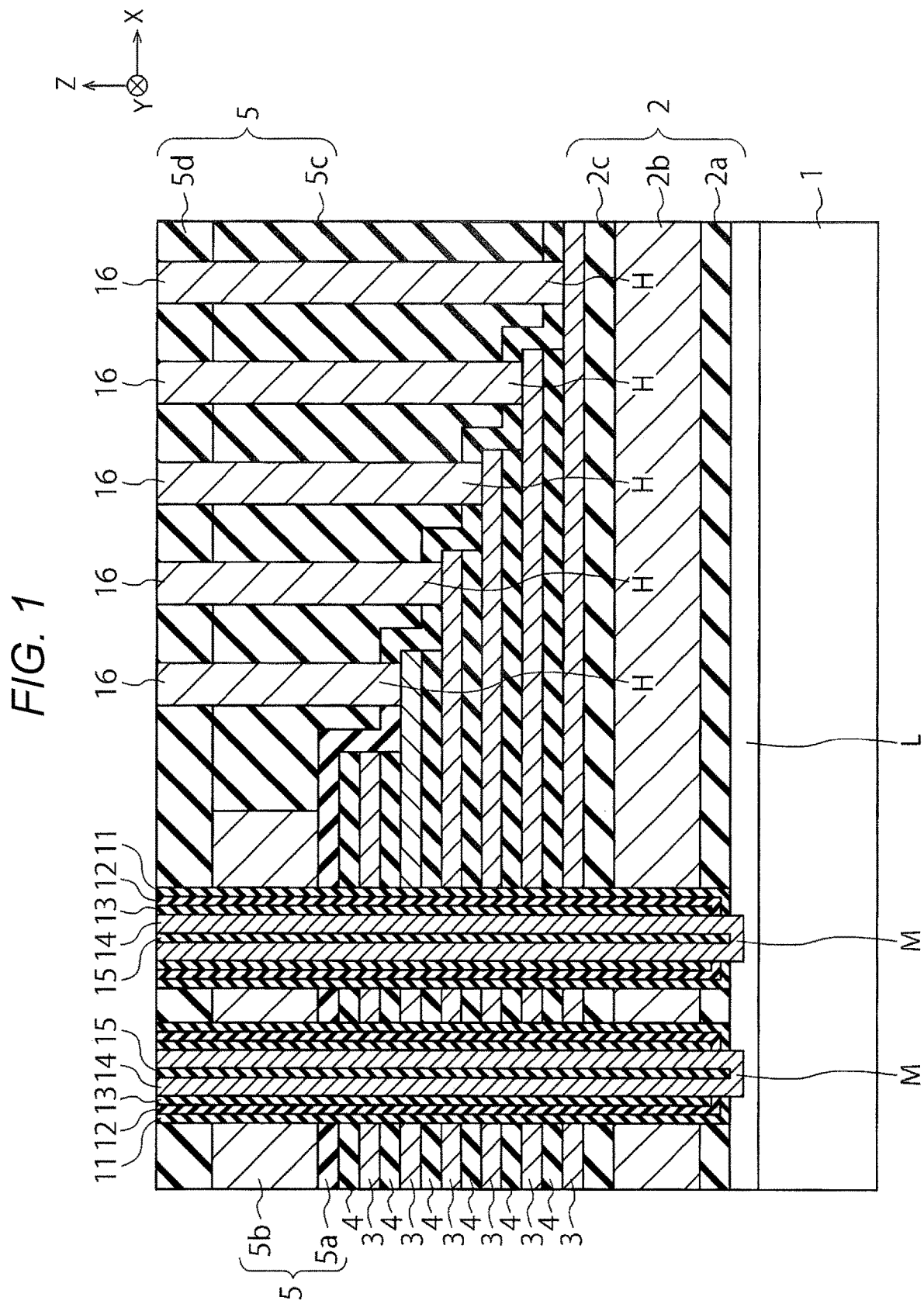
FIG. 1 is a cross-sectional view showing the structure of a semiconductor device according to a first embodiment.

FIG. 1 is a cross-sectional view showing the structure of a semiconductor device according to a first embodiment. The semiconductor device shown in FIG. 1 is a three-dimensional memory.

The semiconductor device shown in FIG. 1 includes a substrate 1, a lower layer 2, a plurality of electrode layers 3, a plurality of insulating layers 4, an upper layer 5, a plurality of memory holes M, and a plurality of contact holes H. The semiconductor device shown in FIG. 1 may further include a block insulating film 11, a charge storage layer 12, a tunnel insulating film 13, a channel semiconductor layer 14 and a core insulating film 15, provided in this order in each memory hole M, and a contact plug 16 provided in each contact hole H.

The substrate 1 is, for example, a semiconductor substrate such as a silicon (Si) substrate. FIG. 1 shows an X direction and a Y direction which are parallel to the surface of the substrate 1 and perpendicular to each other, and a Z direction perpendicular to the surface of the substrate 1. A +Z direction is herein treated as an upward direction, and a −Z direction as a downward direction. The −Z direction may or may not coincide with the direction of gravitational force.

The lower layer 2 is formed on a diffusion layer L which is formed in the substrate 1. The lower layer 2 includes a first lower insulating film 2a, a source-side conductive layer 2b and a second lower insulating film 2c, formed in this order on the substrate 1. The first lower insulating film 2a is, for example, a silicon oxide ($SiO_2$) film. The source-side conductive layer 2b is, for example, a polysilicon layer. The second lower insulating film 2c is, for example, a silicon oxide film.

The electrode layers 3 and the insulating layers 4 are stacked alternately on the lower layer 2. The electrode layers 3 are, for example, metal layers such as tungsten (W) layers, or semiconductor layers such as polysilicon layers, and function as word lines. The insulating layers 4 are, for example, silicon oxide films. FIG. 1 shows the memory holes M that penetrate the stacked film including the electrode layers 3 and the insulating layers 4, and the contact holes H formed on a stair-like region of the stacked film.

The upper layer 5 is formed on the stacked film, and includes a cover insulating film 5a, a drain-side conductive layer 5b, a first interlayer insulating film 5c, and a second interlayer insulating film 5d. The cover insulating film 5a is formed on the stacked film. The drain-side conductive layer 5b is formed on the cover insulating film 5a and located adjacent to the stair-like region. The first interlayer insulating film 5c is formed on the cover insulating film 5a such that it fills the space over the stair-like region. The second interlayer insulating film 5d is formed on the drain-side conductive layer 5b and on the first interlayer insulating film 5c. The cover insulating film 5a is, for example, a silicon oxide film. The drain-side conductive layer 5b is, for example, a polysilicon layer. The first interlayer insulating film 5c is, for example, a silicon oxide film. The second interlayer insulating film 5d is, for example, a silicon oxide film.

The block insulating film 11, the charge storage layer 12, the tunnel insulating film 13, the channel semiconductor layer 14, and the core insulating film 15 are formed in order on the side surface of each memory hole M that penetrates the lower layer 2, the electrode layers 3, the insulating layers 4, and the upper layer 5. Thus, a plurality of memory cells are formed in each memory hole M. The block insulating film 11 is, for example, a silicon oxide film. The charge storage layer 12 may be, for example, a silicon nitride (SiN) film; however, it may alternatively be a semiconductor layer such as a polysilicon layer. The tunnel insulating film 13 is, for example, a silicon oxide film. The channel semiconductor layer 14 is, for example, a semiconductor layer such as a polysilicon layer, and is electrically connected to the diffusion layer L in the substrate 1. The core insulating film 15 is, for example, a silicon oxide film.

In the stair-like region, the contact plugs 16 are formed in the contact holes H that penetrate the upper layer 5. The contact plugs 16 are electrically connected to the electrode layers 3 which are separated from each other. Each contact pug 16 is formed of, for example, a barrier metal layer such as a titanium (Ti)-containing layer or a tantalum (Ta)-containing layer, and a plug material layer such as a tungsten layer, a copper (Cu) layer or an aluminum (Al) layer.

A semiconductor device manufacturing method according to at least one embodiment will now be described with reference to FIGS. 2 through 7B.

Figure 2:
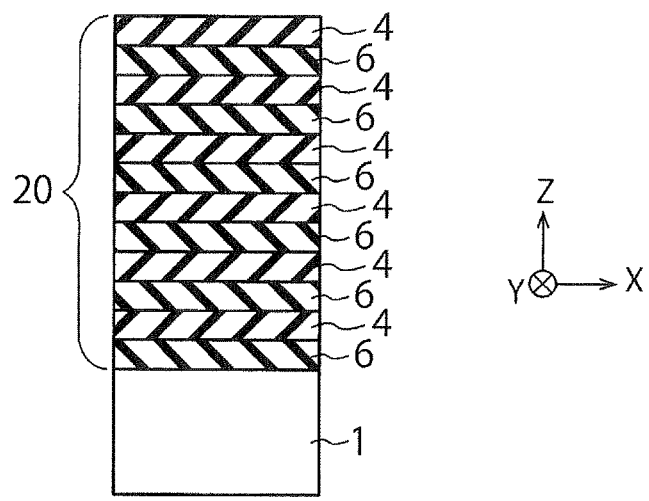
FIG. 2 is a cross-sectional view illustrating a step of forming a stacked body on a substrate according to at least one embodiment.

First, as shown in FIG. 2, a plurality of sacrificial layers 6 and a plurality of insulating layers 4 are stacked alternately on the substrate 1 via the lower layer 2 (see FIG. 1). The sacrificial layers 6 are, for example, silicon nitride films. The sacrificial layers 6 are an example of a first insulating layer in the first film, and the insulating layers 4 are an example of a second insulating layer in the first film.

Instead of stacking the sacrificial layers 6 and the insulating layers 4 alternately on the substrate 1 in the step shown in FIG. 2, electrode layers 3 and the insulating layers 4 may be stacked alternately on the substrate 1. In that case, it is not necessary to perform the below-described step of replacing the sacrificial layers 6 with the electrode layers 3. In that case, the lower layer 2, the electrode layers 3, the insulating layers 4, and the upper layer 5 constitute an example of the first film. The lower layer 2 and the upper layer 5 may be omitted.

Figure 3:
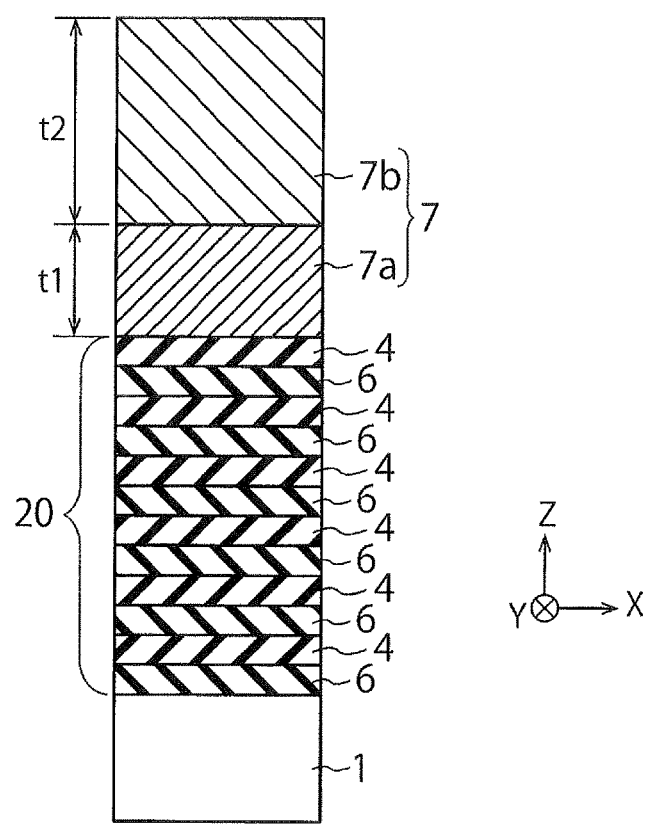
FIG. 3 is a cross-sectional view illustrating a step of forming a mask layer on the stacked body according to at least one embodiment.

Next, as shown in FIG. 3, a mask layer 7 is formed on a stacked body 20, including the sacrificial layers 6 and the insulating layers 4, via the upper layer 5 (see FIG. 1). The mask layer 7 is, for example, a carbon (C) film. The mask layer 7 is an example of the second film. The mask layer 7 of at least one embodiment will now be described in detail.

The mask layer 7 includes a mask layer 7a formed on the stacked body 20, and a mask layer 7b formed on the mask layer 7a. The mask layer 7a is an example of the first layer in the second film, and the mask layer 7b is an example of the second layer in the second film. The mask layer 7a and the mask layer 7b in this embodiment are both carbon films, but have different properties.

The mask layer 7a is, for example, a diamond-like carbon film, while the mask layer 7b is, for example, an amorphous carbon film. Each of the mask layer 7a and the mask layer 7b is a film containing carbon atoms and other atoms, for example, a carbon film containing carbon atoms as a main component and other impurity atoms. For example, the mask layer 7a may contain oxygen atoms as impurity atoms. The oxygen concentration of the mask layer 7a is higher than the oxygen concentration of the mask layer 7b. The oxygen concentration herein refers to the number of oxygen molecules per unit volume.

The mask layer 7a has, for example, the following compositional ratio: 60 atm % of carbon, 10 atm % of oxygen, and 30 atm % of hydrogen. On the other hand, the mask layer 7b has, for example, the following compositional ratio: 85 atm % of carbon and 15 atm % of hydrogen. The mask layer 7a and the mask layer 7b are not limited to such compositional ratios, however. The mask layers 7a, 7b may have any oxygen concentration as long as the oxygen concentration of the mask layer 7a is higher than that of the mask layer 7b. The oxygen concentration of the mask layer 7a is, for example, not less than 4 atm %.

The density of the mask layer 7a is lower than that of the mask layer 7b and is, for example, not more than 1.6 g/cm$^3$.

The mask layer 7a may contain hydrogen atoms as impurity atoms. In that case, the compositional ratio of hydrogen in the mask layer 7a is higher than that in the mask layer 7b and is, for example, not less than 20%. The mask layer 7b may or may not contain oxygen atoms and/or hydrogen atoms.

As shown in FIG. 3, the mask layer 7a is formed thinner than the mask layer 7b. For example, the thickness t1 of the mask layer 7a before etching is 500 nm, while the thickness t2 of the mask layer 7b before etching is 2 μm. The mask layer 7a and the mask layer 7b may be formed, for example, by one of the following methods. In a first method, the mask layer 7a and the mask layer 7b are both formed by CVD (Chemical Vapor Deposition). In a second method, the mask layer 7a and the mask layer 7b are both formed by PVD (Physical Vapor Deposition). In a third method, the mask layer 7a and the mask layer 7b are formed by PVD and CVD, respectively. In a fourth method, the mask layer 7a and the mask layer 7b are formed by a vacuum gas-phase process (e.g. CVD or PVD) and an atmospheric liquid-phase process, respectively. Any of the first to fourth methods may be employed in at least one embodiment.

Examples of the CVD include plasma CVD, thermal CVD, and photo-CVD. On the other hand, examples of the PVD include a sputtering method, an arc ion plating method, an ion vapor deposition method, an ion beam method, and a laser ablation method. In general, a film formed by PVD has a higher density and is harder than a film formed by CVD. In view of this, in the third method, the mask layer 7a is formed by PVD, and the mask layer 7b by CVD. The density of a film may also be adjusted by changing CVD conditions or PVD conditions. Therefore, in the first method, the mask layer 7a and the mask layer 7b are both formed by CVD, and in the second method, the mask layer 7a and the mask layer 7b are both formed by PVD. The first and second methods can form the mask layer 7a and the mask layer 7b by the same vapor deposition method, which simplifies the overall process for forming the mask layer 7a and the mask layer 7b.

In the case of forming a carbon film by CVD, a $C_xH_y$ gas (C represents carbon and H represents hydrogen, and X and Y are integers equal to or greater than 1), for example, is used as a source gas. In this case, the carbon film may contain hydrogen atoms as impurity atoms. Also in the case of forming a carbon film by PVD, the carbon film often contains hydrogen atoms as impurity atoms. Thus, the mask layer 7a and the mask layer 7b of this embodiment, formed by CVD or PVD, may contain hydrogen atoms as impurity atoms.

Figure 4:
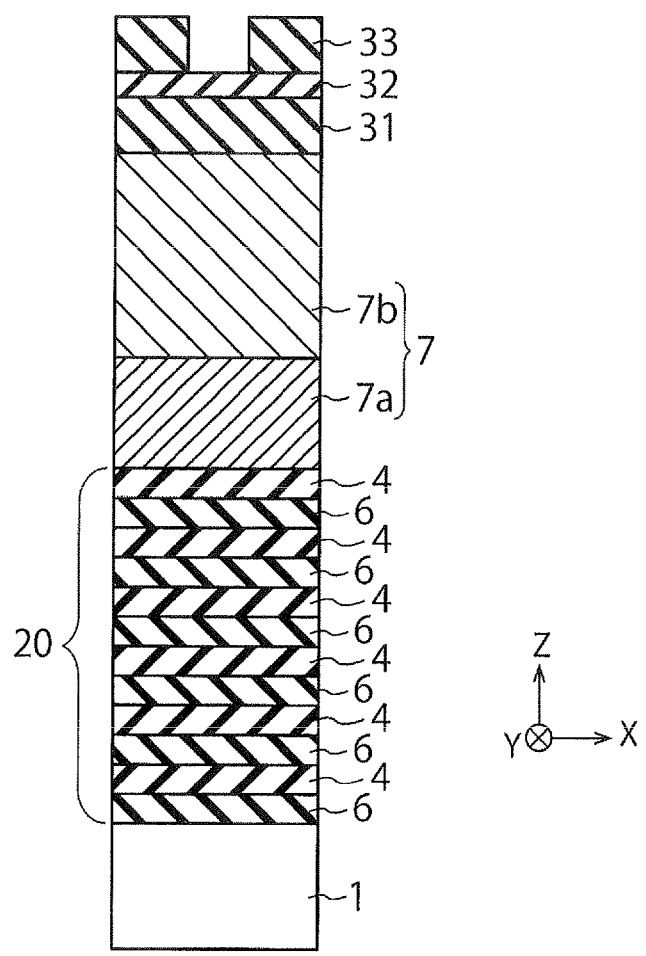
FIG. 4 is a cross-sectional view illustrating a step of forming a hard mask, an antireflection film and a resist film on the mask layer according to at least one embodiment.

As shown in FIG. 4, after forming the mask layer 7 in the above-described manner, a hard mask 31, an antireflection film 32 and a resist film 33 are sequentially formed on the mask layer 7. The hard mask 31 is formed on the mask layer 7b, e.g., by CVD as a silicon oxynitride (SiON) film having a thickness of 150 nm. The antireflection film 32 is formed on the hard mask 31 as an organic film having a thickness of, for example, 10 nm. The antireflection film 32 eliminates the need to impart an antireflection function to the mask layer 7. The resist film 33 is formed, for example, by applying a resist material to a thickness of 150 nm. The resist film 33 is patterned with a liquid immersion exposure apparatus.

After forming the hard mask 31, the antireflection film 32 and the resist film 33 in the above-described manner, the hard mask 31 is dry-etched using the antireflection film 32 and the resist film 33 as an etch mask. Subsequently, the mask layer 7 is dry-etched using the hard mask 31 as an etch mask.

Figure 5:
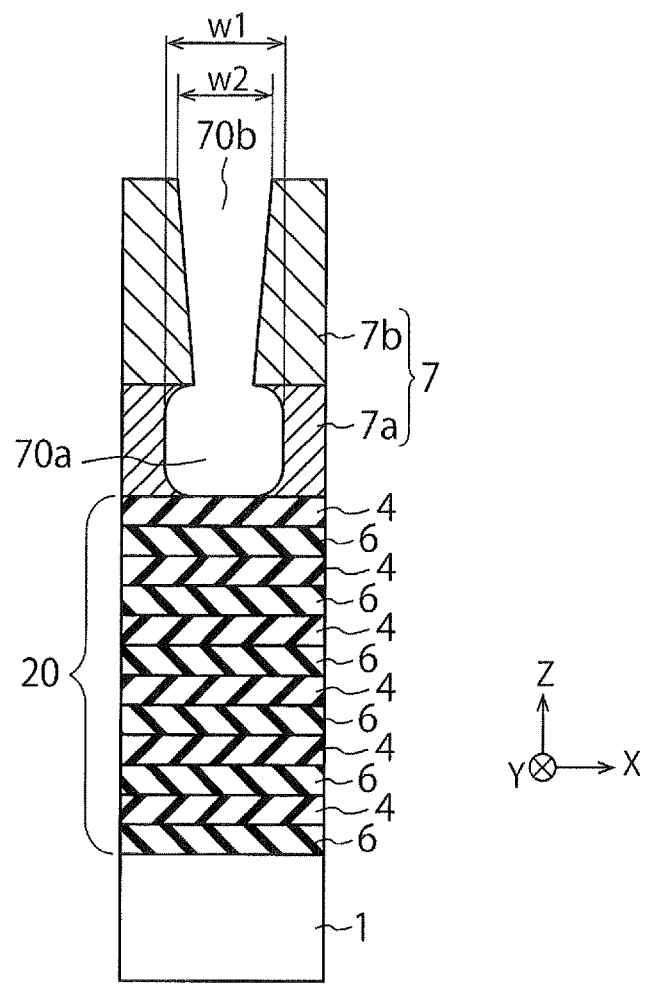
FIG. 5 is a cross-sectional view illustrating a step of forming a hole in the mask layer according to at least one embodiment.

FIG. 5 is a cross-sectional view showing the structure of the mask layer 7 after etching. As shown in FIG. 5, a hole 70a that penetrates the mask layer 7a in the Z direction, and a hole 70b that penetrates the mask layer 7b in the Z direction are formed in the mask layer 7. In at least one embodiment, the oxygen concentration of the mask layer 7a is higher than the oxygen concentration of the mask layer 7b. Further, the carbon concentration of the mask layer 7a is lower than the carbon concentration of the mask layer 7b. Therefore, the amount of side etching of the mask layer 7a in the X direction is larger than the amount of side etching of the mask layer 7b. Accordingly, as shown in FIG. 5, the X-direction diameter w1 of the hole 70a is larger than the X-direction diameter w2 of the hole 70b after etching of the mask layer 7.

Figure 6:
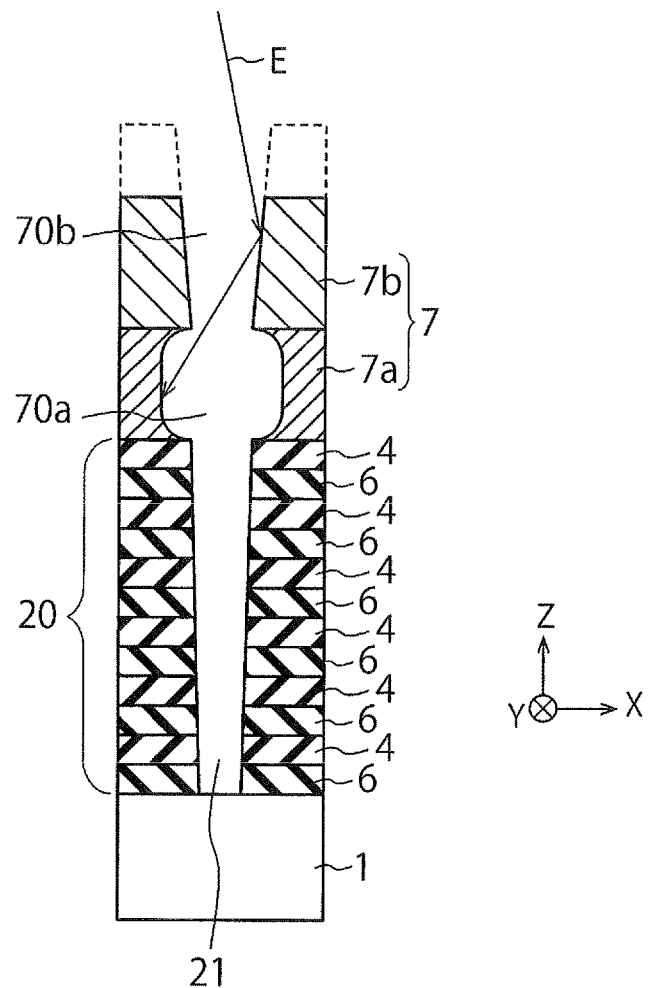
FIG. 6 is a cross-sectional view illustrating a step of forming a recess in the stacked body according to at least one embodiment.

Next, as shown in FIG. 6, the stacked body 20 may be etched e.g. by RIE (Reactive Ion Etching) using the mask layer 7. As a result, a recess 21, which communicates with the hole 70a, is formed in the stacked body 20. The recess 21 is a hole for forming the memory hole M of FIG. 1, and has a generally cylindrical shape. Thereafter, the mask layer 7 is removed.

Figure 7A:
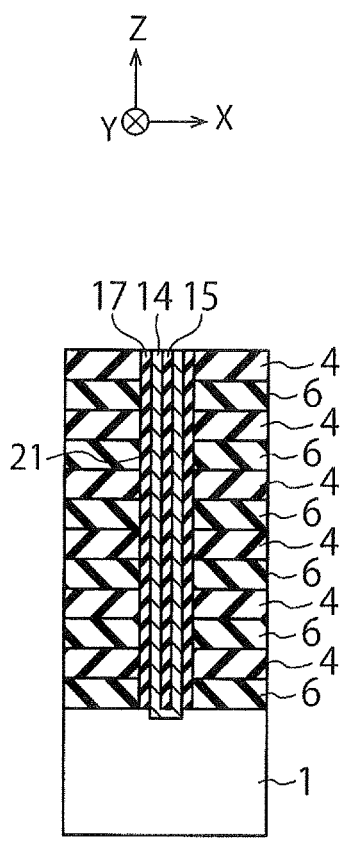
FIG. 7A is a cross-sectional view illustrating a step of forming a memory insulating film, a channel semiconductor layer and a core insulating film in the recess.

Next, as shown in FIG. 7A, a memory insulating film 17, a channel semiconductor layer 14 and a core insulating film 15 are sequentially formed on the side surface and the bottom surface of the recess 21 (memory hole M). The memory insulating film 17 includes the block insulating film 11, the charge storage layer 12 and the tunnel insulating film 13, formed in the listed order, and shown in FIG. 1.

The memory insulating film 17, the channel semiconductor layer 14 and the core insulating film 15 are formed, for example, in the following manner. First, the memory insulating film 17 is formed on the side surface and the bottom surface of the recess 21, and the memory insulating film 17 is removed from the bottom of the memory hole M. As a result, the substrate 1 becomes exposed in the bottom of the memory hole M. Next, the channel semiconductor layer 14 and the core insulating film 15 are sequentially formed on the surfaces of the tunnel insulating film 13 and the substrate 1 in the recess 21. As a result, the channel semiconductor layer 14 is electrically connected to the substrate 1.

Figure 7B:
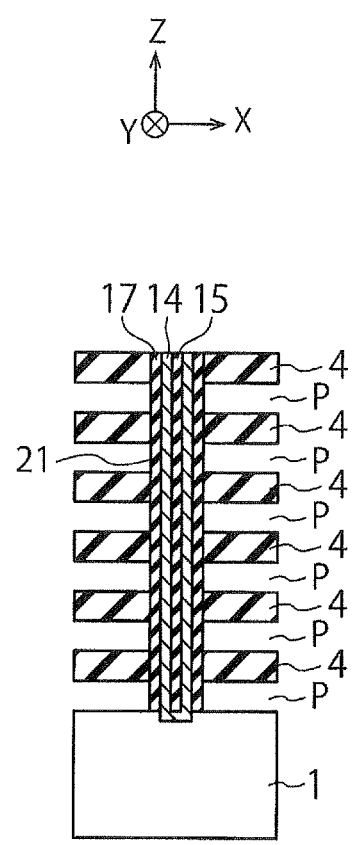
FIG. 7B is a cross-sectional view illustrating a step of etching sacrificial layers according to at least one embodiment.

Next, as shown in FIG. 7B, the sacrificial layers 6 are removed, e.g., with a liquid chemical such as an aqueous solution of phosphoric acid. As a result, cavities P are formed between the insulating layers 4. Thereafter, electrode layers 3 are embedded into the cavities P. As a result, as shown in FIG. 1, a stacked film including the electrode layers 3 and the insulating layers 4 is formed on the lower layer 2. The electrode layers 3 may be formed in the cavities P after forming an insulating film, which constitute part of the block insulating film 11, in the cavities P.

Thereafter, an interconnect layer (s), a plug layer(s), an interlayer insulating film(s), etc. are formed on the substrate 1. In this manner, the semiconductor device of FIG. 1 is manufactured.

Figure 8A:
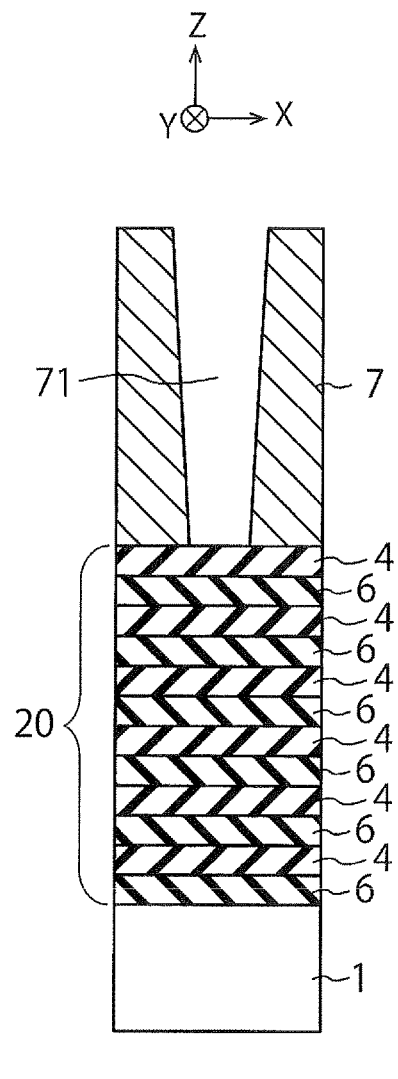
FIG. 8A is a cross-sectional view illustrating a step of forming a hole in a mask of a comparative example.
Figure 8B:
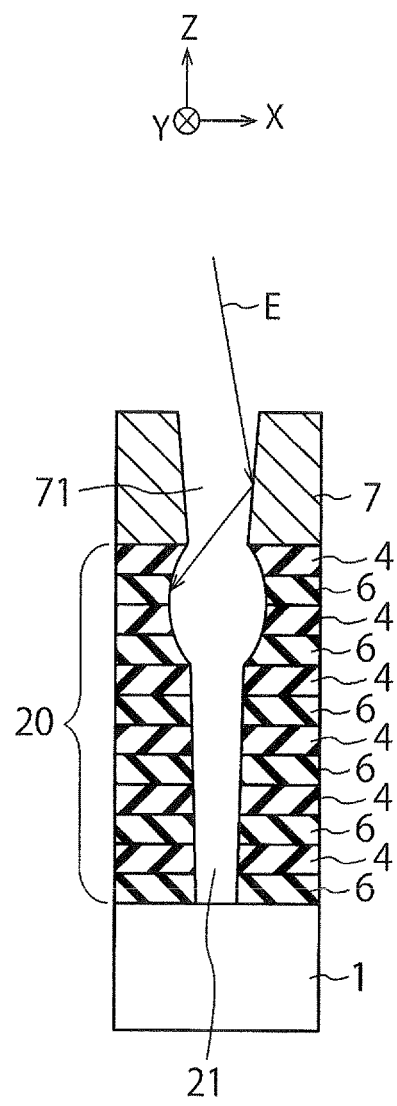
FIG. 8B is a cross-sectional view illustrating a step of forming a recess in a stacked body.

FIGS. 8A and 8B are cross-sectional views illustrating part of a semiconductor device manufacturing process in a comparative example. As shown in FIG. 8A, the mask layer 7 of this comparative example is a single-layer carbon film. A hole 71 is formed in the mask layer 7 by etching using the above-described hard mask 31, antireflection film 32 and resist film 33 as a mask.

After forming the hole 71, a recess 21 is formed in the stacked body 20 by RIE using the mask layer 7. During the RIE, as shown in FIG. 8B, an ion beam E can partly rebound from the interior surface of the hole 71. An upper portion of the recess 21 will be shaped into a curved configuration by such a rebounded ion beam. This produces a large difference in the size (diameter) of the recess 21 (memory hole M) in its entirety ranging from the top to the bottom.

In at least one embodiment, on the other hand, the hole 70a opens wider than the hole 70b as shown in FIG. 6. Therefore, if an ion beam E partly rebounds from the interior surface of the hole 70b of the mask layer 7b, the rebounded ion beam will be absorbed in the hole 70a of the mask layer 7a. This makes it possible to suitably form a recess 21 (memory hole M) with a small size difference along its entirety ranging from the top to the bottom.

While the mask layer 7 of at least one embodiment is used for etching of the to-be-etched film including the plurality of layers (the lower layer 2, the sacrificial layers 6, the insulating layers 4, and the upper layer 5), the mask layer 7 may be used for etching of a to-be-etched film including a single layer. Examples of such a to-be-etched film include a silicon oxide film, a silicon nitride film, a semiconductor layer, a metal layer, etc. The same is true for a second embodiment described later.

(Modification)

A modification of the first embodiment will now be described. A semiconductor device in this modification has the same elements as those of the semiconductor device of the first embodiment shown in FIG. 1, and therefore a description thereof will be omitted. A semiconductor device manufacturing method in this modification will be described, focusing on differences from the first embodiment.

In the first embodiment, the mask layer 7a is formed in an oxygen-containing state e.g. using oxygen gas. In this modification, on the other hand, the mask layer 7a is first formed on the stacked body 20. Thus, the mask layer 7a at this stage has, for example, a compositional ratio of 85 atm % of carbon and 15 atm % of hydrogen, and contains no oxygen.

Figure 9:
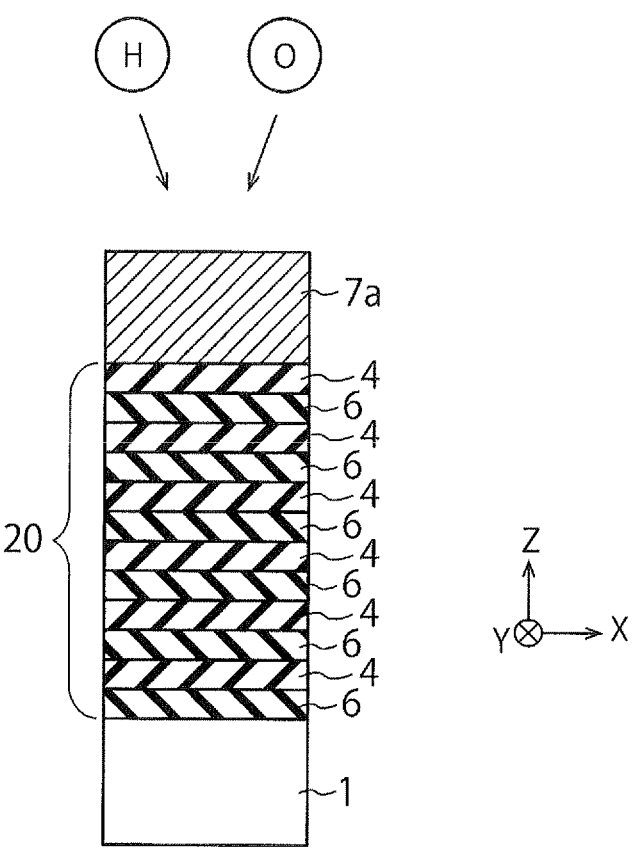
FIG. 9 is a cross-sectional view illustrating a method for producing a modification of a mask according to at least one embodiment.

Next, the mask layer 7a is subjected to steam annealing by exposing the mask layer 7a to steam e.g. for 30 minutes. By the steam annealing, oxygen and hydrogen penetrate into the mask layer 7a as shown in FIG. 9. As a result, the composition of the mask layer 7a changes to 60 atm % of carbon, 10 atm % of oxygen, and 30 atm % of hydrogen.

Next, as with the first embodiment, a mask layer 7b is formed on the mask layer 7a. The subsequent steps are the same as those of the first embodiment, and therefore a description thereof will be omitted.

Also in the modification described hereinabove, the oxygen concentration of the mask layer 7a is higher than the oxygen concentration of the mask layer 7b. Therefore, the hole 70a, which is wider than the hole 70b of the mask layer 7b, is formed in the mask layer 7a. This can avoid shaping of the recess 21 of the stacked body 20 into a curved configuration. Thus, it becomes possible to suitably form the recess 21 (memory hole M) with a small size difference along its entirety ranging from the top to the bottom.

Further, in this modification, oxygen is introduced into the mask layer 7a by steam annealing. The oxygen concentration of the mask layer 7a can therefore be controlled by adjusting steam annealing conditions.

Second Embodiment

The second embodiment will now be described. A semiconductor device of this embodiment has the same elements as those of the semiconductor device of the first embodiment shown in FIG. 1, and therefore a description thereof will be omitted. A semiconductor device manufacturing method of this embodiment will be described, focusing on differences from the first embodiment.

Figure 10:
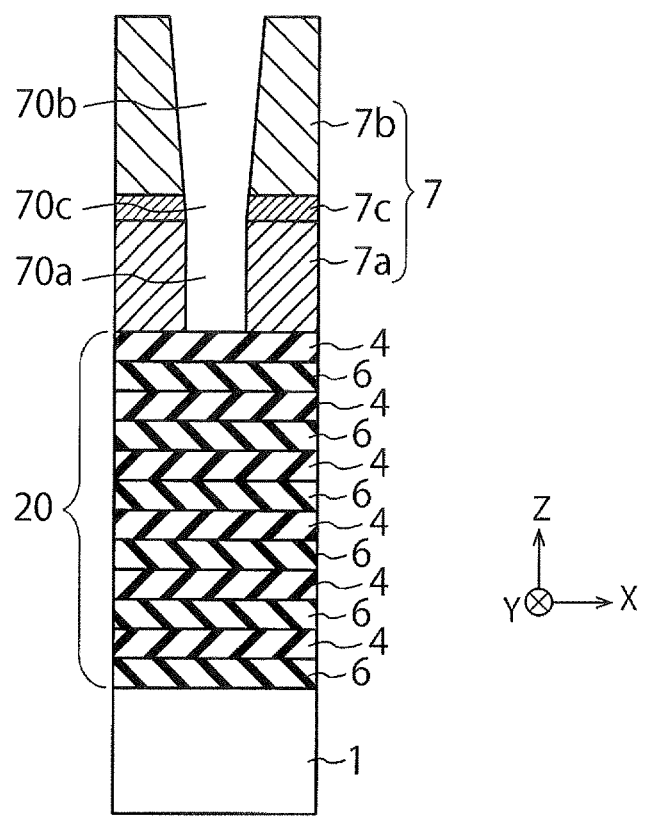
FIG. 10 is a cross-sectional view illustrating part of a semiconductor device manufacturing process according to a second embodiment.

FIG. 10 is a cross-sectional view illustrating part of a semiconductor device manufacturing process according to the second embodiment. As shown in FIG. 10, in addition to the mask layer 7a and the mask layer 7b of the first embodiment, the mask layer 7 of this embodiment also includes a mask layer 7c. The mask layer 7c is an example of a third mask layer, and is disposed between the mask layer 7a and the mask layer 7b. The thickness of the mask layer 7a is, for example, not less than 200 nm. The thickness of the mask layer 7c is preferably not more than ¼ of the thickness of the mask layer 7 (the sum of the thicknesses of the mask layers 7a, 7b, 7c). The mask layer 7c may be a carbon film containing carbon atoms as a main component. The mask layer 7c may further contain oxygen atoms and/or hydrogen atoms as impurity atoms.

In the mask layer 7, the oxygen concentration increases in the following order: the mask layer 7c, the mask layer 7b, and the mask layer 7a. For example, the oxygen concentration of the mask layer 7c is not more than 1 atom %, the oxygen concentration of the mask layer 7a is not less than 4 atom %, and the oxygen concentration of the mask layer 7b has an intermediate value. The difference in oxygen concentration between the mask layer 7a and the mask layer 7b is preferably not less than 3 atom %.

In the mask layer 7, the density increases in the following order: the mask layer 7a, the mask layer 7b, and the mask layer 7c. For example, the density of the mask layer 7c is not less than 2.0 g/cm$^3$, the density of the mask layer 7a is not more than 1.6 g/cm$^3$, and the density of the mask layer 7b has an intermediate value. The difference in density between the mask layer 7a and the mask layer 7b is preferably not less than 0.2 g/cm$^3$.

Further, the compositional ratio of hydrogen increases in the following order: the mask layer 7c, the mask layer 7b, and the mask layer 7a. For example, the compositional ratio of hydrogen in the mask layer 7c is not more than 10%, the compositional ratio of hydrogen in the mask layer 7a is not less than 20%, and the compositional ratio of hydrogen in the mask layer 7b has an intermediate value. The difference in the compositional ratio of hydrogen between the mask layer 7a and the mask layer 7b is preferably not less than 10%.

A hole 70a, which penetrates the mask layer 7a in the Z direction, is formed in the mask layer 7a by etching using the hard mask 31, the antireflection film 32 and the resist film 33, described above with reference to the first embodiment, as a mask. Similarly, a hole 70b is formed in the mask layer 7b, and a hole 70c is formed in the mask layer 7c.

In the above-described mask layer 7 of the first embodiment, the lower mask layer 7a has a high oxygen concentration and a low density. Therefore, the diameter of the hole 70a, formed in the mask layer 7a, may be larger than necessary. Consequently, the top opening of the recess 21, formed in the stacked body 20, may be too wide beyond an acceptable limit.

In order to control the diameter of the top opening of the recess 21 at a desired value, it is conceivable to decrease the diameters of the hole 70a and the hole 70b formed in the mask layer 7 in advance. This method, however, is expected to decrease the etching rate upon the formation of the recess 21 and, in addition, increase the possibility of closure of the mask layer 7.

In this embodiment, on the other hand, the mask layer 7c is formed as a low-oxygen concentration, high-density intermediate layer between the mask layer 7a and the mask layer 7b. Therefore, even when the diameter of the hole 70b of the mask layer 7b is increased, the increase in the diameter of the hole 70a of the mask layer 7a can be reduced. This makes it possible to avoid closure of the mask layer 7 while preventing widening of the top opening of the recess 21.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising:
    forming a first film on a substrate;
    forming a second film containing at least carbon on the first film;
    forming a hole in the second film; and
    forming a recess, which communicates with the hole, in the first film by etching using the second film as a mask,
    wherein the second film includes a first layer formed on the first film, and a second layer formed on the first layer, the first layer having a higher oxygen concentration than the second layer, and
    wherein the second film includes a third layer formed between the first layer and the second layer, and wherein the second layer has a higher oxygen concentration than the third layer.

2. The method for manufacturing a semiconductor device according to claim 1, wherein the thickness of the first layer is at least 200 nm.

3. The method for manufacturing a semiconductor device according to claim 1, wherein the oxygen concentration of the third layer is not more than 1 atom %, and the difference in oxygen concentration between the second layer and the first layer is at least 3 atom %.

4. The method for manufacturing a semiconductor device according to claim 1, wherein the density of the third layer is at least 2.0 g/cm3, and the difference in density between the second layer and the first layer is at least 0.2 g/cm3.

5. The method for manufacturing a semiconductor device according to claim 1, wherein the second film contains hydrogen, and wherein the compositional ratio of hydrogen in the third layer is not more than 10%, and the difference in the compositional ratio of hydrogen between the second layer and the first layer is at least 10%.

6. The method for manufacturing a semiconductor device according to claim 1, wherein the first film includes either: (a) a plurality of first insulating layers and a plurality of second insulating layers, the first insulating layers and the second insulating layers being stacked alternately, or (b) a plurality of electrode layers and a plurality of insulating layers which are stacked alternately.

7. The method for manufacturing a semiconductor device according to claim 1, wherein a thickness of the third layer is not more than ¼ a thickness of the second film.

8. The method for manufacturing a semiconductor device according to claim 1, wherein an oxygen concentration of the third layer is less than an oxygen concentration of the first and second layers, and a density of the third layer is greater than a density of the first and second layers.

9. A method for manufacturing a semiconductor device, comprising:
    forming a first film on a substrate;
    forming a second film containing at least carbon on the first film;
    forming a hole in the second film; and
    forming a recess, which communicates with the hole, in the first film by etching using the second film as a mask,
    wherein the second film includes a first layer formed on the first film, and a second layer formed on the first layer, the first layer having a higher oxygen concentration than the second layer,
    wherein the second film contains hydrogen, and
    wherein the first layer has a higher hydrogen concentration than the second layer.

10. The method for manufacturing a semiconductor device according to claim 9, wherein the second layer comprises amorphous carbon.

11. The method for manufacturing a semiconductor device according to claim 9, wherein the first layer is thinner than the second layer.

12. The method for manufacturing a semiconductor device according to claim 9, wherein the first layer and the second layer are formed by at least one of physical vapor deposition or chemical vapor deposition.

13. The method for manufacturing a semiconductor device according to claim 9, further comprising:
    after forming the second film, forming a hard mask over the second film.

14. A method for manufacturing a semiconductor device, comprising:
    forming a first film on a substrate;
    forming a second film containing at least carbon on the first film;
    forming a hole in the second film; and
    forming a recess, which communicates with the hole, in the first film by etching using the second film as a mask,
    wherein the second film includes a first layer formed on the first film, and a second layer formed on the first layer, the first layer having a higher oxygen concentration than the second layer,
    wherein the first and second layers contain carbon, and
    wherein the first layer comprises diamond like carbon.

15. A method for manufacturing a semiconductor device, comprising:
    forming a first film on a substrate;
    forming a second film containing at least carbon on the first film;
    forming a hole in the second film; and
    forming a recess, which communicates with the hole, in the first film by etching using the second film as a mask,
    wherein the second film includes a first layer formed on the first film, and a second layer formed on the first layer, the first layer having a higher oxygen concentration than the second layer, and each of the first layer and the second layer contains carbon as a main component, and
    wherein oxygen is introduced into the first layer by exposing the first layer to a steam atmosphere for a predetermined time, and then the second layer is formed on the first layer containing oxygen.

16. A method for manufacturing a semiconductor device, comprising:
    forming a first film on a substrate;
    forming a second film containing at least carbon on the first film;
    forming a hole in the second film; and
    forming a recess, which communicates with the hole, in the first film by etching using the second film as a mask,
    wherein the second film includes a first layer formed on the first film, and a second layer formed on the first layer, the first layer having a higher oxygen concentration than the second layer, and
    wherein a diameter of a hole in the first layer is greater than a diameter of the hole in the second layer.

* * * * *